(12) United States Patent
Su

(10) Patent No.: US 8,421,223 B2
(45) Date of Patent: Apr. 16, 2013

(54) CONDUCTIVE STRUCTURE FOR A SEMICONDUCTOR INTEGRATED CIRCUIT

(75) Inventor: Sheng-Chuan Su, Hsinchu (TW)

(73) Assignees: Chipmos Technologies Inc., Hsinchu (TW); Chipmos Technologies (Bermuda), Ltd., Hamilton (BM)

(*) Notice: Subject to any disclaimer, the term of this patent is extended or adjusted under 35 U.S.C. 154(b) by 354 days.

(21) Appl. No.: 12/262,819

(22) Filed: Oct. 31, 2008

(65) Prior Publication Data
US 2009/0206476 A1 Aug. 20, 2009

(30) Foreign Application Priority Data
Feb. 20, 2008 (TW) .............................. 97105885 A

(51) Int. Cl.
*H01L 23/48* (2006.01)

(52) U.S. Cl.
USPC .................... 257/737; 257/732; 257/E21.508

(58) Field of Classification Search .................. 257/432, 257/737, 734, E21.508
See application file for complete search history.

(56) References Cited

U.S. PATENT DOCUMENTS

| 6,812,124 | B2 * | 11/2004 | Weng .............................. 438/613 |
| 6,924,553 | B2 * | 8/2005 | Ohara ............................ 257/738 |
| 2006/0278981 | A1 * | 12/2006 | Trezza et al. ................. 257/734 |
| 2007/0023919 | A1 * | 2/2007 | Lin et al. ....................... 257/774 |

FOREIGN PATENT DOCUMENTS
CN 1700435 11/2005
* cited by examiner

*Primary Examiner* — John C Ingham
(74) *Attorney, Agent, or Firm* — Muncy, Geissler, Olds & Lowe, PLLC

(57) ABSTRACT

A conductive structure for a semiconductor integrated circuit is provided. The semiconductor integrated circuit comprises a pad, and a passivation layer partially overlapping the pad, which jointly define an opening portion. The conductive structure is adapted to be electrically connected to the pad through the opening portion. The conductive structure comprises an under bump metal (UBM). A first conductor layer formed on the under bump metal is electrically connected to the under bump metal. A second conductor layer formed on the first conductor layer and electrically connected to the first conductor layer and a cover conductor layer. Furthermore, the under bump metal, the first conductor layer, and the second conductor jointly define a basic bump structure. The cover conductor layer is adapted to cover the basic bump structure.

3 Claims, 2 Drawing Sheets

CONDUCTIVE STRUCTURE FOR A SEMICONDUCTOR INTEGRATED CIRCUIT

This application claims priority to Taiwan Patent Application No. 097105885 filed on Feb. 20, 2008, the contents of which are incorporated herein by reference in their entirety.

CROSS-REFERENCES TO RELATED APPLICATIONS

Not applicable.

BACKGROUND OF THE INVENTION

1. Field of the Invention

The present invention relates to a conductive structure for a semiconductor integrated circuit (IC). More particularly, the present invention relates to a conductive structure being capable of preventing oxidation of the surface.

2. Descriptions of the Related Art

Bump technology has been widely adopted in some fields, such as microelectronics and micro systems, to provide an electrical connection interface between a semiconductor IC and a circuit board. For example, in the connection between a circuit board and an IC chip, the IC chip may be connected with the circuit board in various manners. The bumps are formed within openings defined by a passivation layer on pads of the IC chip, so that the pads are electrically connected to pins of the circuit board.

Among various metal materials, gold has a superior electrical conductivity. As a result, gold is commonly used in the packaging processes as the bump material and is referred to as a gold bump. As shown in FIG. 1, a bump is formed in an opening defined by a pad 101 and a passaviation layer 102. The bump is defined jointly by a first conductive layer 104, a second conductive layer 105 and an under bump metal (UBM) 103. For this example, the first and the second conductor layers 104, 105 can be both made of gold and are formed as one piece. An UBM 103 on the pad 101 will first be formed in a typical gold bump process. The UBM 103 typically is also electrically connected to a conductive layer (for example, the first conductive layer 104 in FIG. 1) to form the bump through an electroplating process, besides being used as an adhesive layer for connecting the bump and the pad 101. The first conductor layer 104 may be substantially formed at a same or a different time with the UBM 103. The first conductor layer 104 and the UBM 103 may also be formed through the same manufacturing process and with the same material, so that the first conductor layer 104 and the UBM 103 can be used as an electrically conductive medium after the bump is formed. In this way, the bump can be formed above the UBM 103 and electrically connected to the pad 101 via the UBM 103. For example, the UBM 103 may be made of a material selected from a group consisting of titanium (Ti), wolfram (W) and alloys thereof.

Since gold is very expensive, composite bumps made of gold and other metals in combination have been developed in the prior art to reduce the cost. For example, in the bump structure depicted in FIG. 1, the first conductor layer 104 and the second conductor layer 105 are made of materials different from each other. According to such an improved design, in this embodiment where the first conductor layer 104 accounts for a higher percentage in the whole bump than the second conductor layer 105, and the first conductor layer 104 is made of metal material having an electrical conductivity slightly poorer than gold.

In some cases, an intermetallic reaction tends to occur between the first conductor layer 104 and the second conductor layer 105 in a solid phase to cause poor electrical conductivity therebetween, thus adversely affecting the electrical conductivity of the bump as a whole. To improve this problem, a buffer conductor layer 106 is further disposed between the first conductor layer 104 and the second conductor layer 105 in some solutions of the prior art, as shown in FIG. 2.

However, both the aforesaid composite bump and the bump with an additional buffer conductor layer have a prominent shortcoming. That is, when the conductor layers are made of a material other than gold, the surface thereof is liable to oxidation, causing degradation in the electrical conductivity of the whole bump and even damaging the whole bump structure.

In view of this, it is highly desirable in the art to provide a solution that can reduce the cost of the bump while still avoiding oxidation of a surface thereof.

SUMMARY OF THE INVENTION

One objective of this invention is to provide a conductive structure for a semiconductor IC. In accordance with the above objective, the semiconductor IC comprises a pad and a passivation layer partially covering the pad. The pad and the passivation layer jointly define an opening, and the conductive structure is adapted to electrically connect to the pad through the opening. In addition, the conductive structure further comprises an UBM, a first conductor layer and a second conductor layer, all of which jointly define a basic bump structure. The first conductor layer accounts for a higher percentage in the bump structure than the second conductor layer, so the first conductor layer may be made of metal materials other than gold to reduce the cost.

Another objective of this invention is to provide a conductive structure that is less liable to oxidation on a surface thereof. In accordance with the above objective, in addition to the aforesaid features, the conductive structure further comprises a cover conductor layer adapted to cover the basic bump structure. The cover conductor layer is made of a material selected from metal materials less liable to oxidation, so the composite bump will not oxidize on the surface.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
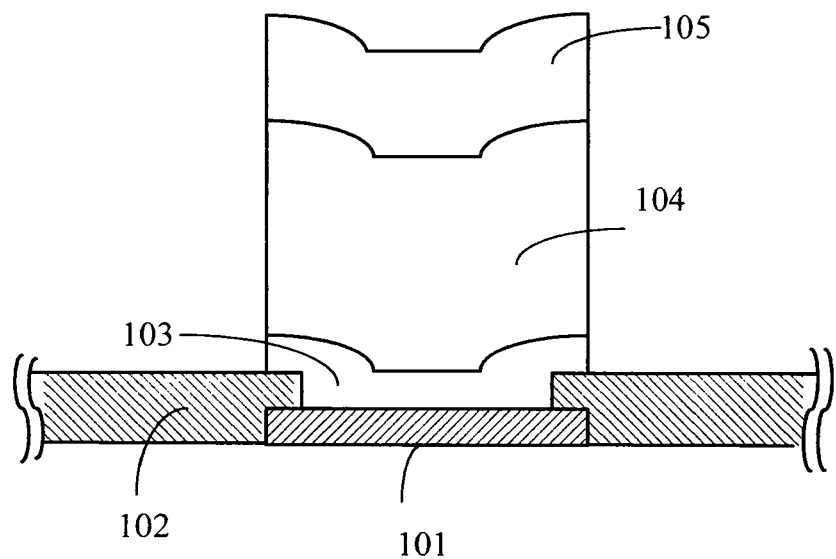
FIG. 1 is a schematic view of a bump structure of the prior art.
Figure 2:
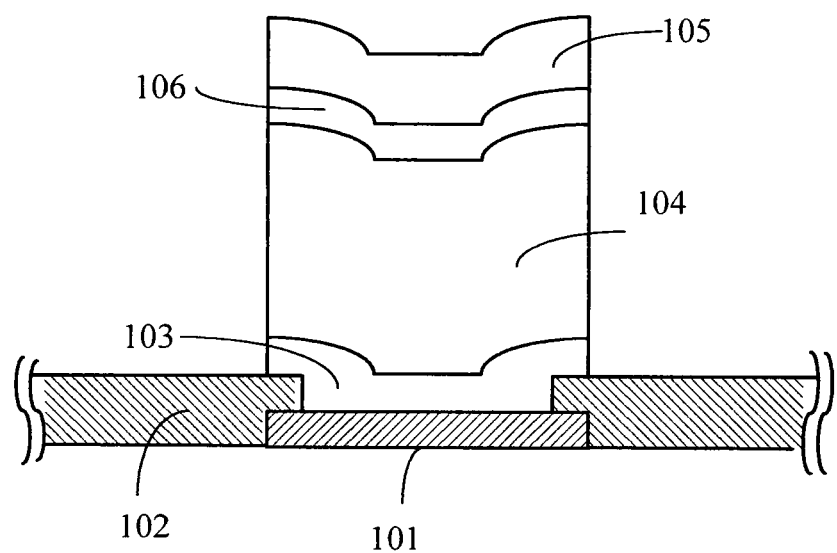
FIG. 2 is another schematic view of a bump structure of the prior art.
Figure 3:
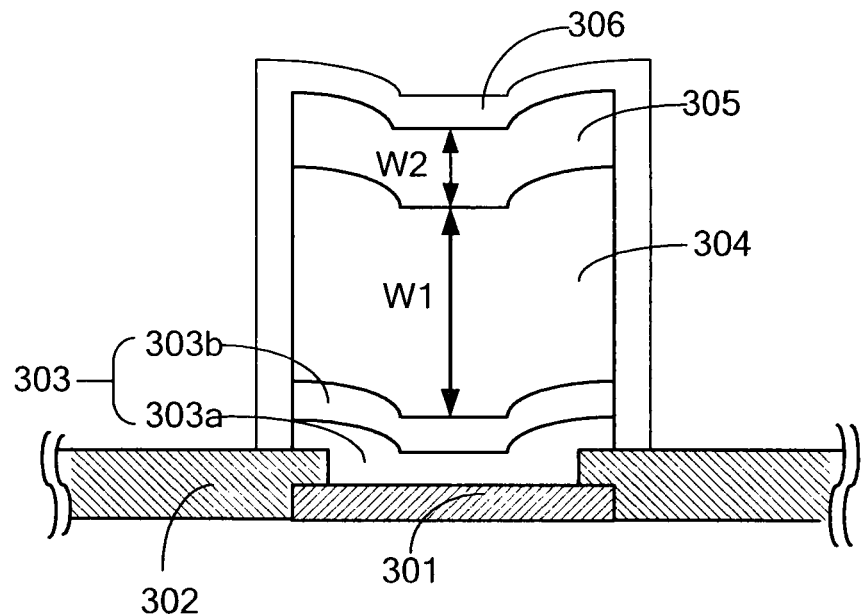
FIG. 3 is a schematic view of a first embodiment of this invention.

FIG. 3 depicts a first embodiment of this invention, which is a conductive structure for a semiconductor IC. The semiconductor IC comprises a pad 301 and a passivation layer 302 partially covering the pad 301. The pad 301 and the passivation layer 302 jointly define an opening, so that the conductive layer may be appropriately electrically connected to the pad 301 through the opening. Generally speaking, the opening is formed early when the semiconductor IC is fabricated to facilitate subsequent formation of the conductive structure.

In this embodiment, the conductive structure comprises an UBM 303, a first conductor layer 304, a second conductor layer 305 and a cover conductor layer 306. It should be noted that except for the cover conductor layer 306, the method of forming the conductive structure is well-known to those skilled in the art. For example, the UBM 303 is used as a conductive medium to form the first and the second conductor layers 304, 305 by an electroplating process. Thus, this will not be further described herein.

The UBM 303 is at least partially formed within the opening to completely cover the opening. The first conductor layer 304 having a first vertical dimension W1 is formed on the UBM 303, and electrically connected to the UBM 303. The second conductor layer 305 having a second vertical dimension W2 is in turn formed on the first conductor layer 304, and electrically connected to the first conductor layer 304. The first vertical dimension W1 is substantially no less than the second vertical dimension W2 to reduce the production cost by forming the larger conductor layer (i.e., the first conductor layer 304) with a material cheaper than gold. The UBM 303, the first conductor layer 304 and the second conductor layer 305 jointly define a basic bump structure. The cover conductor layer 306 is adapted to completely cover the basic bump structure, including the sides of the UBM 303, to prevent oxidation of the basic bump structure and to secure the basic bump structure.

In this embodiment, the UBM 303 further comprises a first metal layer 303a formed on the pad 301 and a second metal layer 303b formed on the first metal layer 303a. The first metal layer 303a and the second metal layer 303b are made of materials different from each other. In other embodiments, the UBM 303 may also be comprised of only a single metal layer. Furthermore, the materials that are selected for the first metal layer 303a and the second metal layer 303b depends on the material of the first conductor layer 304 that will be formed thereon, which will be described in detail hereinafter.

The second conductor layer 305 is made, of gold because of the superior electrical conductivity of gold. As described above, the second conductor layer 305 may be formed by electroplating gold. The first conductor layer 304 is made of copper, which has a slightly greater electrical conductivity than gold. Accordingly, the first metal layer 303a may be selected from a group consisting of Ti, W, and alloys thereof, while the second metal layer 303b may be made of the same material (i.e., copper) as the first conductor layer 304.

Additionally, gold is not liable to oxidation, so the cover conductor layer 306 may be made of gold by an electroless plating process (e.g., a chemical plating process). The cover conductor layer 306 is formed to cover the exposed portions of the surface of the whole bump. The cover conductor layer 306 mainly serves to prevent oxidation of the basic bump structure. The cover conductor layer 306 is substantially formed with an average thickness of 1 micrometer (μm) since the thickness of the cover conductor layer 306 does not substantially improve the electrical conductivity of the bump structure.

It follows from the above disclosure that this invention reduces the cost by using gold only for portions of the basic bump structure, for example, in the second conductor layer 305 and the cover conductor layer 306 in the above embodiment. Meanwhile, the basic bump structure is covered by the cover conductor layer 306 to prevent oxidation of the surface of the bump structure, thus overcoming the problems of the prior art.

Figure 4:
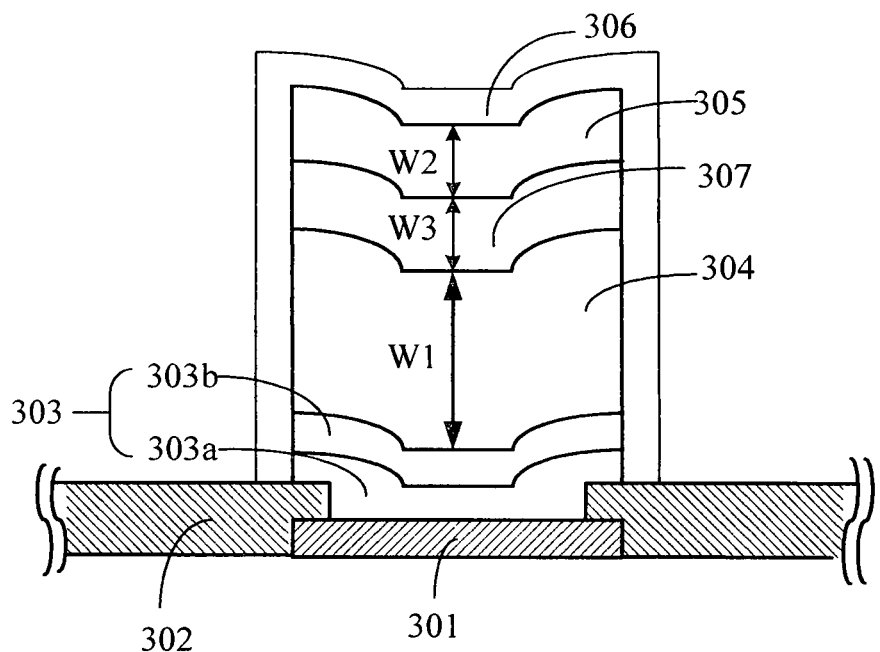
FIG. 4 is a schematic view of a second embodiment of this invention.

FIG. 4 illustrates a schematic view of a second embodiment of this invention. As compared to the previous embodiment, this embodiment primarily differs in that a buffer conductor layer 307 is formed between the first conductor layer 304 and the second conductor layer 305 to electrically connect with the first conductor layer 304 and the second conductor layer 305 respectively. The buffer conductor layer 307 has a third vertical dimension W3 which is not substantially greater than the first vertical dimension W1.

The buffer conductor layer 307 mainly prevents the intermetallic reaction between the first conductor layer 304 and the second conductor layer 305 in a solid phase, which would otherwise degrade the electrical conductivity therebetween and adversely affect the electrical conductivity of the whole bump. In this embodiment, the buffer conductor layer 307 is made of nickel. Other portions of the second embodiment are identical to those with the same reference numerals of the first embodiment and thus, will not be described again herein.

Similarly, according to the second embodiment of this invention, the additional buffer conductor layer 307 prevent the intermetallic reaction between the first conductor layer 304 and the second conductor layer 305, because two of which have similar electrical conductivities. Meanwhile, the cover conductor layer 306 is capable of protecting portions of the bump surface that are liable to oxidation, thus overcoming the problem of the prior art.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A conductive structure for a semiconductor integrated circuit, wherein the semiconductor integrated circuit comprises a pad and a passivation layer partially covering the pad, the pad and the passivation layer jointly define an opening, and the conductive structure is adapted to electrically connect to the pad through the opening, the conductive structure comprising:

an under bump metal (UBM), being formed at least partially within the opening, and comprising a first and a second metal layer, wherein the first metal layer is made of Ti and formed on the pad, and the second metal layer is made of copper and formed on the first metal layer;

a first conductor layer, having a first vertical dimension, being made of copper and being formed on the UBM to electrically connect to the UBM;

a second conductor layer, which is made of gold, having a second vertical dimension and being formed on the first conductor layer to electrically connect to the first conductor layer, wherein the first vertical dimension is substantially equal to or lager than the second vertical dimension;

a buffer conductor layer, being formed between the first conductor layer and the second conductor layer and electrically connected to the first conductor layer and the second conductor layer, wherein the buffering layer is made of nickel; and a cover conductor layer, being formed by a chemical plating process to have an average thickness of one micrometer;

wherein the UBM, the first conductor layer and the second conductor layer are formed with an identical cross-sectional dimension to jointly define a basic bump structure, and the cover conductor layer is formed to extend from the passivation layer to completely cover the basic bump structure, the cover conductor layer further covers side surfaces of the UBM;

wherein the first conductor layer is made of metal having an electrical conductivity higher than the electrical conductivity of gold.

2. The conductive structure of claim 1, wherein the cover conductor layer is made of gold.

3. The conductive structure of claim 1, wherein the buffer conductor layer has a third vertical dimension, and the first vertical dimension is equal to or larger than the third vertical dimension.

* * * * *